United States Patent
Lee et al.

(10) Patent No.: US 6,767,813 B2
(45) Date of Patent: Jul. 27, 2004

(54) INTEGRATED CIRCUIT DEVICES HAVING ACTIVE REGIONS WITH EXPANDED EFFECTIVE WIDTHS AND METHODS OF MANUFACTURING SAME

(75) Inventors: Kang-yoon Lee, Kyungki-do (KR); Jong-woo Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/057,745

(22) Filed: Oct. 26, 2001

(65) Prior Publication Data

US 2002/0109182 A1 Aug. 15, 2002

(30) Foreign Application Priority Data

Oct. 28, 2000 (KR) .......................................... 2000-63711

(51) Int. Cl.⁷ ............................................ H01L 21/336
(52) U.S. Cl. ...................... 438/585; 438/259; 438/296; 438/424; 438/433; 438/778
(58) Field of Search ................................ 438/296, 297, 438/294, 295, 259, 270, 248, 391, 589, 595

(56) References Cited

U.S. PATENT DOCUMENTS

| | | | | |
|---|---|---|---|---|
| 5,246,877 A | * | 9/1993 | Hisamoto et al. ........... 438/295 |
| 5,877,532 A | * | 3/1999 | Ahn et al. ................... 257/344 |
| 5,886,382 A | * | 3/1999 | Witek .......................... 257/329 |
| 6,013,551 A | * | 1/2000 | Chen et al. ................. 438/264 |
| 6,146,970 A | * | 11/2000 | Witek et al. ................ 438/424 |
| 6,184,091 B1 | * | 2/2001 | Gruening et al. ........... 438/270 |
| 6,306,712 B1 | * | 10/2001 | Rodder et al. ............. 438/289 |
| 6,339,004 B1 | * | 1/2002 | Kim .......................... 438/296 |
| 6,403,429 B2 | * | 6/2002 | Noble ........................ 438/294 |
| 6,417,047 B1 | * | 7/2002 | Isobe ......................... 438/258 |
| 6,479,369 B1 | * | 11/2002 | Miyoshi ..................... 438/435 |

FOREIGN PATENT DOCUMENTS

JP 11243195 9/1999

* cited by examiner

Primary Examiner—Caridad Everhart
Assistant Examiner—Chuong Anh Luu
(74) Attorney, Agent, or Firm—Myers Bigel Sibley & Sajovec, P.A.

(57) ABSTRACT

An integrated circuit device includes a substrate that has a trench formed therein. An isolation layer is disposed in the trench and covers a first sidewall portion of the trench. A gate electrode is disposed on a second sidewall portion of the trench.

24 Claims, 4 Drawing Sheets

INTEGRATED CIRCUIT DEVICES HAVING ACTIVE REGIONS WITH EXPANDED EFFECTIVE WIDTHS AND METHODS OF MANUFACTURING SAME

RELATED APPLICATION

This application claims the benefit of Korean Patent Application No. 2000-63711, filed Oct. 28, 2000, the disclosure of which is hereby incorporated herein by reference.

FIELD OF THE INVENTION

The present invention relates generally to field effect transistors and, more particularly, to integrated circuit devices incorporating field effect transistors and methods of manufacturing same.

BACKGROUND OF THE INVENTION

As the integration density of a semiconductor chip increases, the size of a semiconductor chip generally decreases. Accordingly, as a semiconductor device, such as a dynamic random access memory (DRAM) device becomes more minute, it may be difficult to ensure that a cell transistor (cell Tr) maintains a sufficient drive capability.

In the case of a DRAM device, although the size of a memory cell transistor may decrease, the threshold voltage across a memory cell transistor is still typically kept at about 1 volt based on the refresh characteristics of the DRAM device. The gate length of a memory cell transistor and the width of an active region within a memory cell transistor may decrease as the size of a semiconductor device is reduced. To maintain the threshold voltage across a memory cell transistor at about 1 volt, channel density may be increased. Increasing the channel density, however, may cause the junction electric field to increase and the density of defects to increase, which may degrade the refresh characteristics of the DRAM device.

Also, a shallow junction is generally needed to reduce the size of a semiconductor device and to decrease the impurity concentration of a drain or a source region. Consequently, parasitic resistance may rapidly increase and the driving ability of a memory cell transistor (e.g., the current through the cell transistor) may fall sharply.

As the size of a semiconductor chip decreases and the integration density increases, shallow trench isolation (STI) may be used to isolate individual devices from each other. STI is advantageous in that it may be used as an isolation technique in devices that have high pattern densities and it generally exhibits favorable isolation characteristics. The advantages of STI notwithstanding, if a transistor has an active region with a generally small width, then the threshold voltage across the transistor may decline.

SUMMARY OF THE INVENTION

According to embodiments of the present invention, an integrated circuit device comprises a substrate that has a trench formed therein. An isolation layer is disposed in the trench and covers a first sidewall portion of the trench. A gate electrode is disposed on a second sidewall portion of the trench. The effective width of an active region, which may act as a transistor channel under the gate electrode, may be increased by the length of the second sidewall portion of the trench. Moreover, the increased channel width of the transistor may result in an increase in the current driving capability of the transistor.

In other embodiments of the present invention, a gate insulating layer is disposed between the gate electrode and the second sidewall portion of the trench, a buffer layer is disposed between the isolation layer and the trench, and a liner layer is disposed between the isolation layer and the buffer layer.

In still other embodiments of the present invention, the second sidewall portion of the trench comprises a layer that has been doped with an impurity, such as boron.

In further embodiments of the present invention, the trench may be formed by forming an oxide layer on the substrate, forming a mask on the oxide layer, patterning the mask to expose at least a portion of the oxide layer, and then etching the exposed portion of the oxide layer.

In still further embodiments of the present invention, the isolation layer may be formed by filling the trench with insulating material so as to cover the mask. The insulating material may then be planarized until a surface of the mask is exposed. The insulating material is then patterned so that the mask extends through a surface of the insulating material. Etching is performed to substantially remove the mask from the upper surface of a mesa adjacent to the trench. The insulating material is etched so that the insulating material covers the first portion of the sidewall and exposes the second portion of the sidewall.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
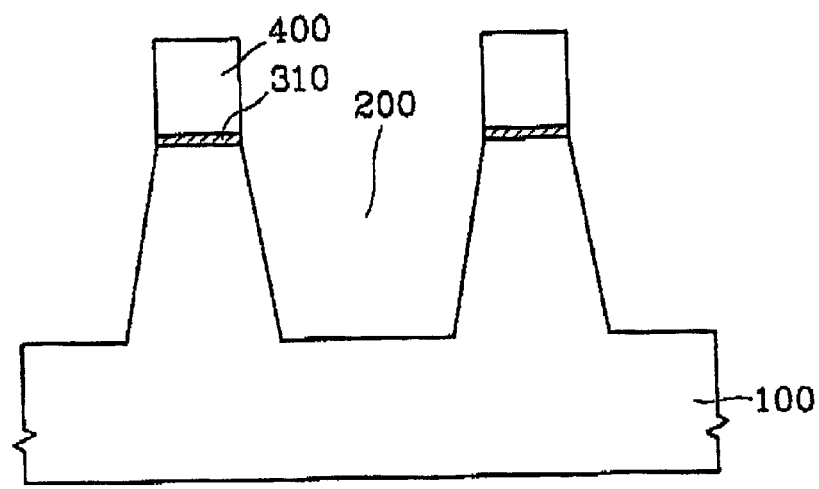
FIGS. 1–8 are cross sectional views that illustrate integrated circuit devices having active regions with expanded effective widths and methods of manufacturing same in accordance with embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. It will also be understood that when an element, such as a layer, region, or substrate, is referred to as being "on" another element, it can be directly on the other element or intervening elements may be present. In contrast, when an element, such as a layer, region, or substrate, is referred to as being "directly on" another element, there are no intervening elements present.

FIGS. 1 through 6 are sectional views that illustrate integrated circuit devices having active regions with expanded effective widths and methods of manufacturing same in accordance with embodiments of the present invention. Referring now to FIG. 1, an integrated circuit device comprises a substrate 100, such as a silicon substrate, that has a trench 200 formed therein. In more detail, a pad oxide layer 310 is formed on the substrate 100 to a thickness of about 100 Å using a conventional thermal oxidation. After forming the pad oxide layer 310, a mask 400 is formed on predetermined regions of the substrate 100 and the pad oxide layer 310. The mask 400 may comprise a silicon nitride layer and may be patterned using photolithography. A portion of the substrate 100 not covered by the mask 400 is etched using a photolithographic process, such as a shallow trench isolation (STI) process. Consequently, a trench 200 dividing a pair of mesas is formed in the substrate 100. The depth of the trench 200 may vary depending on the type of semiconductor device being manufactured. In an exemplary embodiment, the trench 200 is formed to a depth of about 2500 Å.

Figure 2:
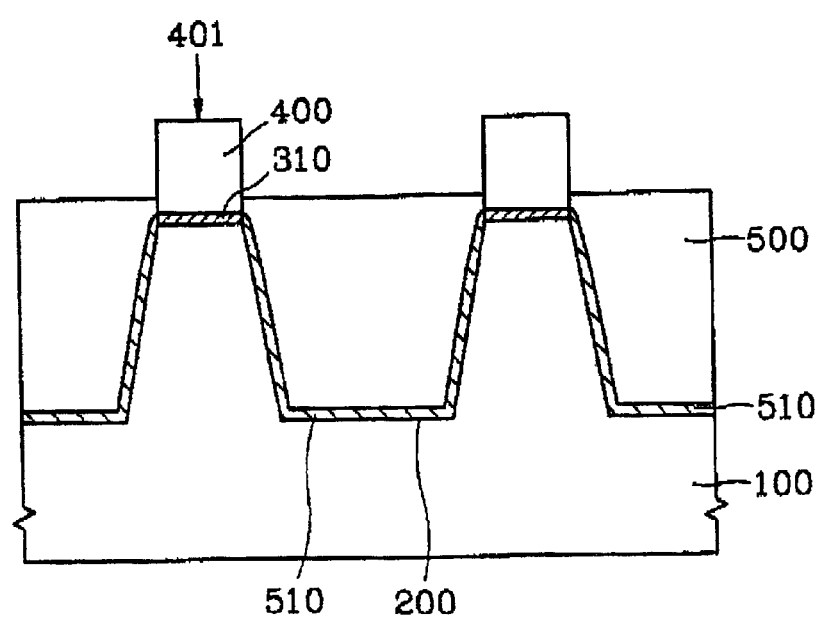

Referring now to FIG. 2, the trench 200 is filled with an isolation layer 500 as part of the STI process. The isolation layer may comprise an insulating material, such as silicon oxide. After the isolation layer 500 is formed, the isolation layer 500 may be thermally treated to densify the isolation layer 500. A chemical mechanical polishing (CMP) procedure may then be performed to planarize the isolation layer 500 until a surface of the isolation layer 500 is substantially level with the top surface 401 of the mask 400 such that the top surface 401 is exposed.

For the benefit of subsequent processes, the isolation layer 500 is further etched using an isotropic and/or an anisotropic etching process. For example, after the CMP process, the isolation layer 500 may be etched to reduce its thickness by approximately 1500 Å. As a result, the isolation layer 500 is patterned so that the top surface of the isolation layer 500 is lower than the top surface 401 of the mask 400. Wet etching may be performed using a conventional oxide etchant in an isotropic etching process and dry etching may be performed with respect to a silicon oxide in an anisotropic etching process.

In other embodiments, a buffer layer 510 may be formed on the substrate 100 before forming the isolation layer 500. The buffer layer 510 may alleviate stress between the silicon oxide of the isolation layer 500 and the silicon of the substrate 100. The buffer layer 510 may comprise a silicon oxide layer, which can be transformed into a thermal oxide layer using an oxygen source.

Figure 3:
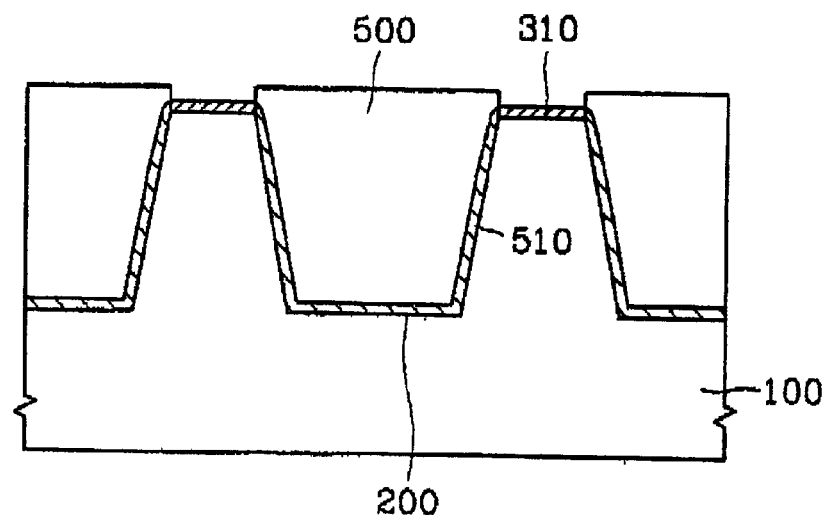

Referring now to FIG. 3, after the isolation layer 500 is patterned, the mask 400 is removed using a conventional process, such as an isotropic wet etching process, to strip the silicon nitride comprising the mask 400. After removal of the mask 400, the surface of the isolation layer 500 is substantially level with the mesas in the substrate 100, which are adjacent to the trench 200.

Figure 4:
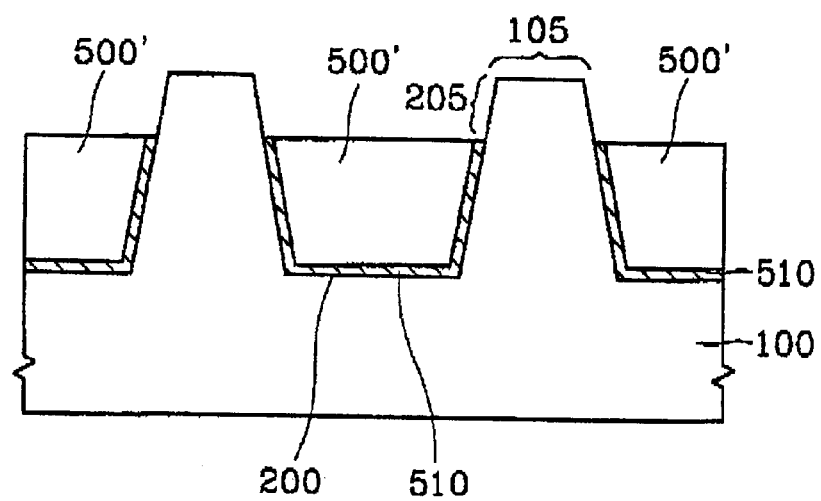

Referring now to FIG. 4, the isolation layer 500 is further etched to form an isolation layer 500' in which the upper sidewalls 205 of the mesas adjacent the trench 200 are exposed. The isolation layer 500 may be selectively etched, for example, by wet etching using an oxide etchant in an isotropic etching process and/or by dry etching using an etchant having a relatively high selectivity ratio with respect to the silicon oxide of the isolation layer 500 and the silicon of the substrate 100, respectively. The isolation layer 500 may be etched to reduce its thickness by approximately 500 Å so that the top surface of the isolation layer 500' is about 500 Å lower than the upper surface 105 of the mesas in the substrate 100. In addition to etching the isolation layer 500, the buffer layer 510 may also be etched so as to remove portions thereof.

After etching the isolation layer 500 to form the isolation layer 500', the upper sidewalls 205 of the mesas adjacent to the trench 200 are exposed. The length of the upper sidewalls 205 may vary in accordance with embodiments of the present invention. By controlling the extent to which the isolation layer 500 is etched, the lengths of the upper sidewalls 205 may be set. In exemplary embodiments of the present invention, each of the upper sidewalls 205 may be approximately 500 Å long.

In some embodiments of the present invention, an upper sidewall 205 may be at least 15% of the length of an upper surface 105 of a mesa adjacent the trench 200. In other embodiments, an upper sidewall 205 maybe approximately 30%–60% of the length of an upper surface 105 of a mesa adjacent the trench 200. When the isolation layer 500' is formed to be as thin as possible without losing its isolation characteristics, the lengths of the upper sidewalls 205 exhibit their maximum values. It is, therefore, possible to increase the lengths of the upper sidewalls 205 as long as the isolation layer 500' is not thinned to an extent that the isolation characteristics of the isolation layer 500' are degraded.

Figure 5:
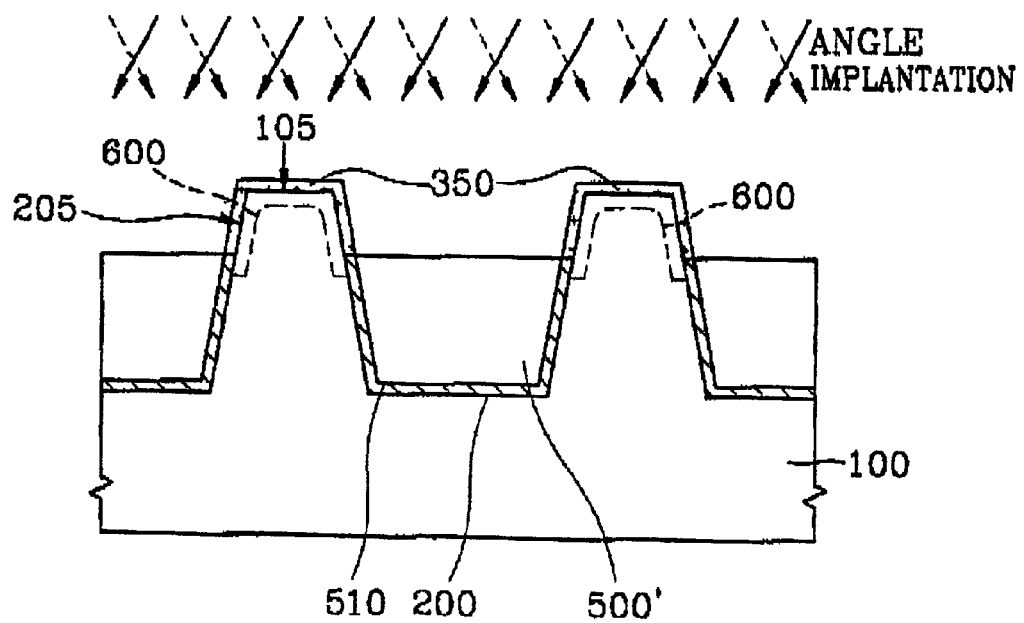

Referring now to FIG. 5, after the isolation layer 500' is formed, a sacrificial oxide layer 350 or a pad oxide layer used for ion implantation is formed on the upper surface 105 of the substrate 100 and the upper sidewalls 205. Before the sacrificial oxide layer 350 is formed, however, the substrate 100 may be washed. After forming the sacrificial oxide layer 350, an impurity layer 600 is formed in the upper sidewalls 205 by ion implantation and may be used to control the threshold voltage. Before the impurity layer 600 is formed, well ion implantation or field ion implantation may be performed. The well ion implantation and/or the field ion implantation procedures may be performed using conventional processes typically used to form a transistor.

When using NMOS technology in the manufacture of DRAMs, the impurity layer 600 may be formed by doping a p-type impurity, such as boron. The impurity layer 600, which may be used to control the threshold voltage, is disposed beneath the upper surface 105 of the substrate 100 and beneath the surface of the upper sidewalls 205. The impurity used in the doping process may be extracted toward an insulating layer (not shown), which is subsequently formed on the substrate 100. Due to the impurity extraction or segregation, the impurity concentration of the impurity layer 600 may be reduced near the upper sidewalls 205.

To address this problem, the impurity layer 600 used for controlling the threshold voltage may be formed by angle implantation. That is, ion impurities may be implanted at an oblique angle with respect to a plane formed by the non-etched portion of the substrate 100. The inclination angle of the ion implantation process may be varied, and the angle implantation process may be performed by symmetric insertion or rotating insertion. Consequently, using angle implantation, the impurity concentration in the upper sidewalls 205 may be increased. The impurity layer 600 used for controlling the threshold voltage has a substantially uniform depth and is disposed beneath the upper surface 105 of the substrate 100 and beneath the surface of the upper sidewalls 205.

Figure 6:
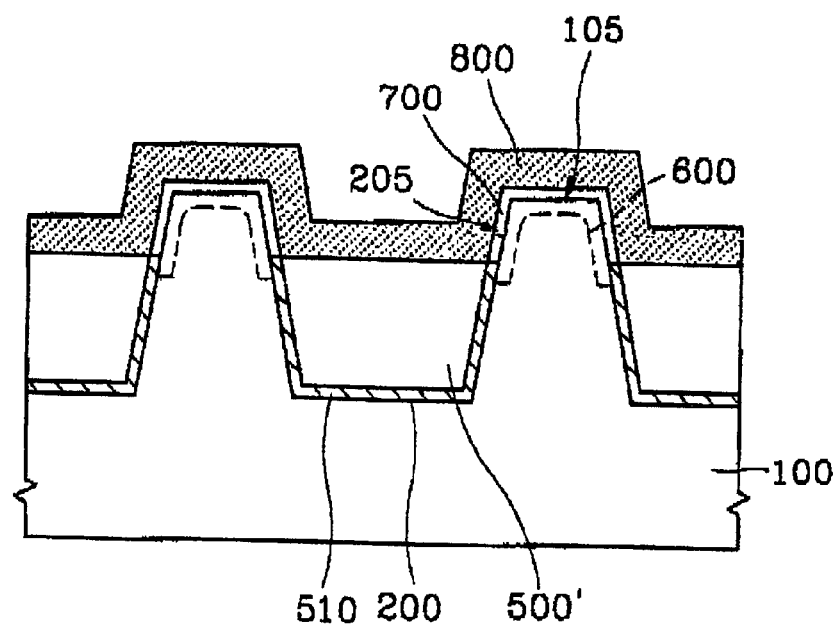

Referring now to FIG. 6, the sacrificial oxide layer 350 used for the ion implantation is removed by an isotropic etching process, such as a wet etching process. A gate insulating layer 700, which may comprise a conventional oxide material, is then formed on the exposed portions of the mesas adjacent the trench 200 (i.e., the upper surface 105 of the substrate and the upper sidewalls 205). The gate insulating layer 700 may have a thickness of about 50 Å.

After the formation of the gate insulating layer 700, a conductive material is deposited on the gate insulating layer

700, thereby forming a gate electrode 800. As illustrated in FIG. 6, the gate insulating layer 700 is interposed between the gate electrode 800 and the upper surface 105 of the substrate 100 and also between the gate electrode 800 and the upper sidewalls 205.

Advantageously, the effective width of an active region, which acts as a transistor channel under the gate electrode 800, may be increased by adding the lengths of the upper sidewalls 205 to the length of the upper surface 105 of the substrate. Thus, the effective width of an active region comprises the lengths of both upper sidewalls 205 along with the length of the upper surface 105 of the substrate. After the gate electrode 800 is formed, drain/source regions are formed, thereby forming a transistor having an active region with an expanded effective width and, therefore, a channel with an expanded effective width.

The current driving capability of a memory cell transistor is inversely proportional to the channel length and is proportional to the width of the gate electrode 800 (i.e., the width of a channel). Consequently, the increased channel width of the transistor may result in an increase in the current driving capability. Thus, even in more highly integrated chips that use smaller devices, the effective width or effective area of an active region may be increased in accordance with embodiments of the present invention, which may preserve the current driving capability of a transistor.

For example, if the upper surface 105 of the substrate 100, which has been defined by photolithography, has a width of 1000 Å and each of the upper sidewalls 205 has a width of 500 Å, the effective width of an active region is 2000 Å. In contrast with conventional design rules in which the active region width corresponds to the length of the upper surface 105, the effective width of an active region may be doubled.

As described above, in accordance with embodiments of the present invention, it is possible to increase the effective width of an active region in a transistor, which may obviate the need to increase channel density for the purpose of maintaining the transistor threshold voltage. Advantageously, embodiments of the present invention may improve the refresh characteristics of a DRAM device by inhibiting increases in junction electric field and/or reducing the density of defects.

Figure 7:
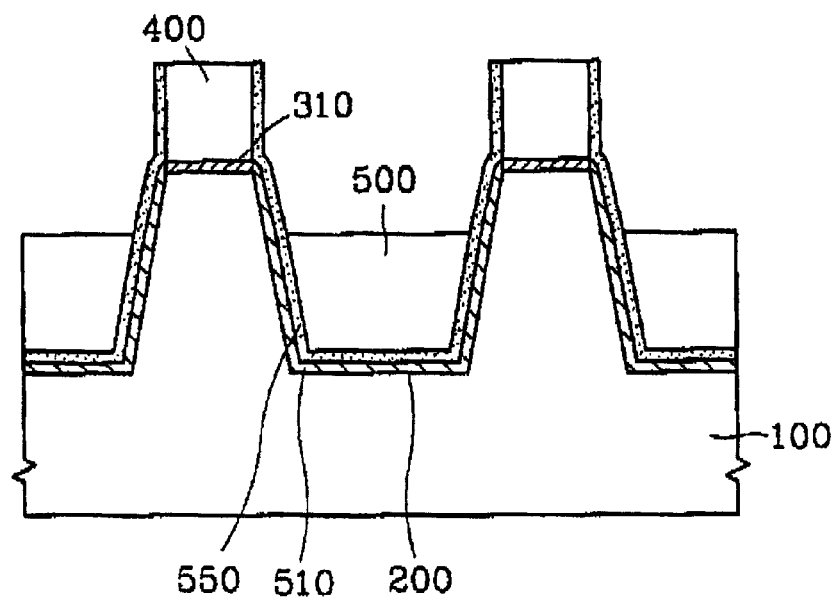
Figure 8:
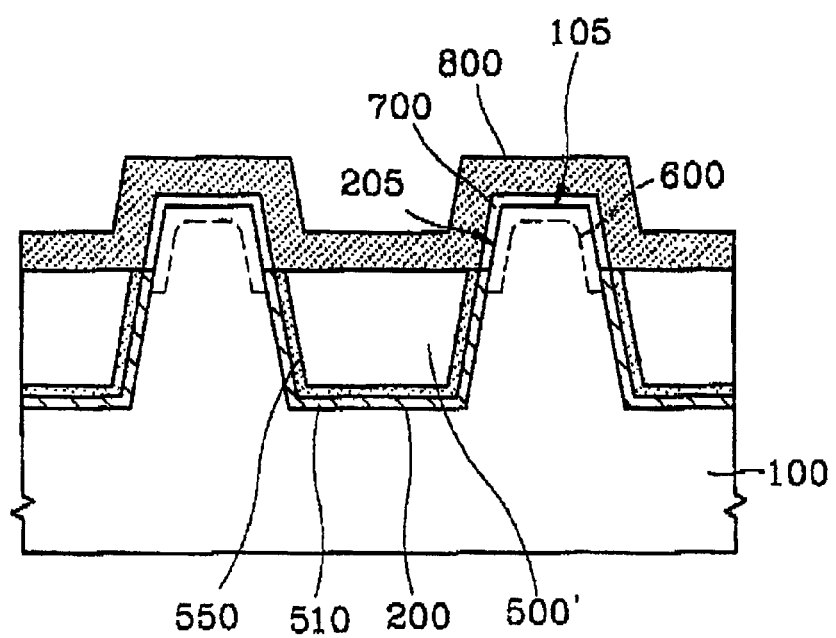

FIGS. 7 and 8 are sectional views that illustrate integrated circuit devices having active regions with expanded effective widths and methods of manufacturing same in accordance with further embodiments of the present invention. As shown in FIG. 7, after the trench 200 is formed by selectively etching the substrate 100 with the use of a mask 400 and after the buffer layer 510 is formed, a liner 550, which may comprise a silicon nitride layer, is formed on the buffer layer 510. The liner 550 may alleviate stresses caused by the isolation layer 500 during subsequent thermal oxidation and/or annealing processes. Also, the liner 550 may inhibits the occurrence of defects, such as pits, which may form on the substrate 100. Referring now to FIG. 8, after the isolation layer 500 is formed on the liner 550, an isolation layer 500' is formed by etching the isolation layer 500. Subsequently, a gate insulating layer 700 and a gate electrode 800 are formed. The embodiments of FIGS. 7 and 8 may provide an active region with an enhanced effective width similar to the embodiments of FIGS. 1–6. In addition, the embodiments of FIGS. 7 and 8 may reduce defects caused by the influence of subsequent processes on the isolation layer 500'.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. A method of manufacturing an integrated circuit device, comprising:
    forming a trench in a substrate;
    forming an isolation layer comprising an insulating material in the trench so as to cover a first sidewall portion of the trench and an entire bottom of the trench and to expose a second sidewall portion of the trench;
    forming an impurity layer in the second sidewall portion of the trench; and
    forming a gate electrode on the second sidewall portion of the trench.

2. The method of claim 1, wherein forming the gate electrode comprises:
    forming a gate insulating layer on the second sidewall portion of the trench; and
    forming the gate electrode on the gate insulating layer.

3. The method of claim 1, wherein forming the isolation layer comprises:
    forming a buffer layer in the trench; and
    forming the isolation layer on the buffer layer in the trench.

4. The method of claim 3, wherein forming the isolation layer comprises:
    forming a liner layer on the buffer layer; and
    forming the isolation layer on the liner layer in the trench.

5. A method of manufacturing an integrated circuit device, comprising:
    etching a substrate to form a trench and a mesa therein, the mesa comprising an upper surface and a sidewall, which is adjacent the trench;
    filling an entire bottom of the trench with an insulating material so as to cover a first portion of the sidewall and to expose a second portion of the sidewall;
    implanting ion impurities in the second portion of the sidewall and the upper surface; and
    forming a gate electrode on the second portion of the sidewall and the upper surface.

6. The method of claim 5, wherein the etching step comprises:
    forming an oxide layer on the substrate;
    forming a mask on the oxide layer;
    patterning the mask to expose at least a portion of the oxide layer; and
    etching the exposed portion of the oxide layer and the substrate to form the trench and the mesa.

7. The method of claim 6, wherein filling the trench with the insulating material comprises:
    filling the trench with the insulating material so as to cover the mask;
    planarizing the insulating material until a surface of the mask is exposed;
    patterning the insulating material so that the mask extends through a surface of the insulating material;
    etching the mask to substantially remove the mask from the upper surface of the mesa; and
    etching the insulating material so that the insulating material covers the first portion of the sidewall and exposes the second portion of the sidewall.

8. The method of claim 5, further comprising:
forming a buffer layer in the trench before filling the trench with the insulating material; and
thermally treating the insulating material after filling the trench with the insulating material.

9. The method of claim 5, wherein implanting ion impurities comprises:
implanting ion impurities at an oblique angle with respect to a plane formed by a non-etched portion of the substrate in the second portion of the sidewall and the upper surface.

10. The method of claim 5, wherein forming the gate electrode comprises:
forming an oxide layer on the second portion of the sidewall and the upper surface;
implanting ion impurities through the oxide layer in the second portion of the sidewall and the upper surface;
etching the oxide layer; and
forming the gate electrode on the second portion of the sidewall and the upper surface.

11. A method of manufacturing a semiconductor device comprising the steps of:
forming a trench by etching a semiconductor substrate;
partially filling the trench with an isolation layer comprising an insulation material, which leaves upper sidewalls of the trench exposed, but covers an entire bottom of the trench;
forming an impurity layer to control threshold voltage beneath the surface of the upper sidewalls of the trench and beneath an upper surface of the semiconductor substrate adjacent to the trench;
forming a gate insulating layer on the upper sidewalls of the exposed trench and the upper surface of the semiconductor substrate adjacent to the trench; and
forming a gate electrode on the gate insulating layer.

12. The method of manufacturing a semiconductor device of claim 11 further comprising the step of forming a buffer layer at the interface between the isolation layer and the trench.

13. The method of manufacturing a semiconductor device of claim 12 further comprising the step of forming a liner of a silicon nitride layer at the interface between the buffer layer and the isolation layer.

14. The method of manufacturing a semiconductor device of claim 11, wherein the surface of the isolation layer is lower than the upper surface of the semiconductor substrate.

15. The method of manufacturing a semiconductor device of claim 11, wherein the step of forming the isolation layer comprising the steps of:
forming a filling layer which fills the trench; and
etching the filling layer to a predetermined thickness so as to expose the upper sidewalls of the trench.

16. The method of manufacturing a semiconductor device of claim 11, wherein the step of forming the trench comprises the steps of:
forming a pad oxide layer on the semiconductor substrate;
forming a mask on the pad oxide layer; and
etching the semiconductor substrate using the mask as an etching mask, and the step of forming the isolation layer comprises the steps of:
forming a filling layer which fills the trench;
chemically and mechanically polishing the filling layer so as to expose the surface of the mask;
etching the surface of the polished filling layer exposed by the mask;
removing the mask; and
etching the resultant filling layer so as to expose the upper sidewalls of the trench.

17. The method of manufacturing a semiconductor substrate of claim 11, wherein the impurity layer is formed using angle implantation.

18. The method of manufacturing a semiconductor device of claim 11, wherein the gate electrode covers the upper sidewalls of the trench and the surface of the isolation layer and is formed on the gate insulating layer which is interposed between the gate electrode and the upper surface of the semiconductor substrate.

19. A method of manufacturing an integrated circuit device, comprising:
forming a mesa structure having sidewalls and a top surface in a substrate;
forming an impurity layer in the top surface and respective upper portions of the sidewalls; and
forming a gate electrode on the mesa structure that extends across the top surface and down the respective upper portions of the sidewalls.

20. The method of claim 19, wherein forming the gate electrode comprises:
forming a gate insulating layer on respective upper portions of the sidewalls; and
forming the gate electrode on the gate insulating layer.

21. The method of claim 19, further comprising:
forming an isolation layer comprising an insulating material on respective lower portions of the sidewalls.

22. The method of claim 21, wherein forming the mesa structure comprises:
forming a pair of trenches on opposing sides of the mesa structure; and wherein forming the isolation layer comprises:
forming the isolation layer in the respective trenches so as to cover the respective lower portions of the sidewalls.

23. The method of claim 22, wherein forming the isolation layer further comprises:
forming a buffer layer in the respective trenches; and
forming the isolation layer on the buffer layer in the respective trenches.

24. The method of claim 23, wherein forming the isolation layer further comprises:
forming a liner layer on the buffer layer; and
forming the isolation layer on the liner layer in the respective trenches.

* * * * *